(12) United States Patent
Endo et al.

(10) Patent No.: US 8,770,143 B2
(45) Date of Patent: Jul. 8, 2014

(54) MULTI-REGION PROCESSING SYSTEM

(75) Inventors: Rick Endo, San Carlos, CA (US); Kurt Weiner, San Jose, CA (US); Indranil De, Mountain View, CA (US); James Tsung, Milpitas, CA (US); Maosheng Zhao, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 106 days.

(21) Appl. No.: 13/106,059

(22) Filed: May 12, 2011

(65) Prior Publication Data

US 2011/0209663 A1 Sep. 1, 2011

Related U.S. Application Data

(62) Division of application No. 11/965,689, filed on Dec. 27, 2007, now Pat. No. 8,039,052.

(60) Provisional application No. 60/970,500, filed on Sep. 6, 2007.

(51) Int. Cl.
| | |
|---|---|
| C23C 16/00 | (2006.01) |
| C23C 16/50 | (2006.01) |
| B05B 1/28 | (2006.01) |
| B05D 1/10 | (2006.01) |
| B05D 1/00 | (2006.01) |
| B05D 3/00 | (2006.01) |
| H05H 1/24 | (2006.01) |
| C23F 1/00 | (2006.01) |
| H01L 21/306 | (2006.01) |
| C25B 11/00 | (2006.01) |
| B05B 15/04 | (2006.01) |
| B05B 15/12 | (2006.01) |

(52) U.S. Cl.
CPC . *C23C 16/50* (2013.01); *B05D 1/10* (2013.01); *B05D 1/62* (2013.01); *B05B 15/0425* (2013.01); *B05B 15/1296* (2013.01); *Y10S 438/942* (2013.01)
USPC ......... 118/723 R; 118/64; 118/326; 118/715; 118/719; 427/398.4; 427/569; 427/248.1; 204/298.26; 438/942; 216/37; 134/36; 156/345.22

(58) Field of Classification Search
CPC B05B 15/1207; B05B 15/1296; B05B 15/04; B05B 15/0425; B05C 15/00; B05D 1/10; B05D 1/62
USPC .............. 118/715, 719, 723 R, 323, 64, 326; 427/398.4, 569, 248.1; 204/298.26, 204/298.23; 438/942; 216/37; 134/36; 156/345.22
See application file for complete search history.

(56) References Cited

U.S. PATENT DOCUMENTS

| | | | | | |
|---|---|---|---|---|---|
| 4,993,358 | A | * | 2/1991 | Mahawili | 427/248.1 |
| 5,009,738 | A | * | 4/1991 | Gruenwald et al. | 156/345.47 |
| 5,171,360 | A | * | 12/1992 | Orme et al. | 164/46 |
| 5,292,400 | A | * | 3/1994 | Mumola | 216/71 |

(Continued)

FOREIGN PATENT DOCUMENTS

JP 2005120456 5/2005

*Primary Examiner* — Dah-Wei D Yuan
*Assistant Examiner* — Karl Kurple

(57) ABSTRACT

The various embodiments of the invention provide for relative movement of the substrate and a process head to access the entire wafer in a minimal space to conduct combinatorial processing on various regions of the substrate. The heads enable site isolated processing within the chamber described and method of using the same are described.

13 Claims, 9 Drawing Sheets

(56) References Cited

U.S. PATENT DOCUMENTS

| | | | |
|---|---|---|---|
| 5,529,815 A * | 6/1996 | Lemelson | 427/575 |
| 5,654,041 A * | 8/1997 | Appich et al. | 427/434.5 |
| 5,811,021 A * | 9/1998 | Zarowin et al. | 216/67 |
| 5,911,834 A * | 6/1999 | Fairbairn et al. | 134/1.3 |
| 6,010,570 A * | 1/2000 | Motoda et al. | 118/323 |
| 6,245,392 B1 * | 6/2001 | Hillenbrand | 427/498 |
| 6,312,526 B1 * | 11/2001 | Yamamuka et al. | 118/720 |
| 6,340,501 B1 * | 1/2002 | Kamiyama et al. | 427/255.6 |
| 6,439,712 B1 * | 8/2002 | Mizutani et al. | 347/102 |
| 6,475,285 B2 * | 11/2002 | Ikegami et al. | 118/715 |
| 6,490,994 B1 * | 12/2002 | Yoshizawa | 118/723 ER |
| 6,491,759 B1 * | 12/2002 | Christen et al. | 118/722 |
| 6,673,155 B2 * | 1/2004 | Nagashima et al. | 118/666 |
| 6,746,539 B2 * | 6/2004 | Sun et al. | 118/715 |
| 6,877,853 B2 * | 4/2005 | Kiguchi et al. | 347/102 |
| 7,114,802 B2 * | 10/2006 | Kiguchi et al. | 347/101 |
| 7,279,044 B2 * | 10/2007 | Park et al. | 118/323 |
| 7,380,690 B2 * | 6/2008 | Sekiya | 222/594 |
| 7,510,611 B2 * | 3/2009 | Minami et al. | 118/321 |
| 7,517,560 B2 * | 4/2009 | Motomura | 427/434.5 |
| 7,572,686 B2 * | 8/2009 | Levy et al. | 438/149 |
| 7,618,493 B2 * | 11/2009 | Yamada et al. | 118/715 |
| 7,625,493 B2 * | 12/2009 | Yamazaki | 216/4 |
| 7,780,821 B2 * | 8/2010 | Nolan et al. | 204/192.26 |
| 7,789,963 B2 * | 9/2010 | Mitrovic et al. | 118/729 |
| 7,806,989 B2 * | 10/2010 | Sekiguchi et al. | 134/30 |
| 7,824,935 B2 * | 11/2010 | Verma et al. | 438/18 |
| 8,070,926 B2 * | 12/2011 | Nolan et al. | 204/298.25 |
| 8,399,794 B2 * | 3/2013 | Tsuji et al. | 219/121.36 |
| 2002/0187265 A1 * | 12/2002 | Mori et al. | 427/282 |
| 2003/0116432 A1 * | 6/2003 | Schweitzer et al. | 204/298.11 |
| 2004/0067641 A1 * | 4/2004 | Yudovsky | 438/680 |
| 2005/0016463 A1 | 1/2005 | Hirano | |
| 2005/0150760 A1 * | 7/2005 | He et al. | 204/298.26 |
| 2006/0191484 A1 * | 8/2006 | Mitrovic et al. | 118/729 |
| 2006/0231031 A1 * | 10/2006 | Dings et al. | 118/723 R |
| 2006/0292845 A1 * | 12/2006 | Chiang et al. | 438/597 |
| 2007/0054044 A1 * | 3/2007 | Shimosaki et al. | 427/248.1 |
| 2007/0074661 A1 * | 4/2007 | Franken et al. | 118/715 |
| 2007/0224348 A1 * | 9/2007 | Dickey et al. | 427/248.1 |
| 2008/0166884 A1 * | 7/2008 | Nelson et al. | 438/765 |
| 2008/0245770 A1 * | 10/2008 | Brancher et al. | 216/58 |
| 2008/0314522 A1 * | 12/2008 | Bera et al. | 156/345.33 |
| 2009/0061087 A1 * | 3/2009 | Endo et al. | 427/255.5 |
| 2009/0061108 A1 * | 3/2009 | Endo et al. | 427/569 |
| 2009/0066976 A1 * | 3/2009 | Uchida et al. | 358/1.7 |
| 2009/0069924 A1 * | 3/2009 | Endo et al. | 700/114 |
| 2009/0130858 A1 * | 5/2009 | Levy | 438/765 |
| 2009/0145746 A1 * | 6/2009 | Hollars | 204/192.25 |
| 2009/0159441 A1 * | 6/2009 | Marunaka et al. | 204/298.16 |
| 2010/0012275 A1 * | 1/2010 | Yamashita | 156/345.41 |
| 2010/0044213 A1 * | 2/2010 | Wolf et al. | 204/192.12 |
| 2011/0023775 A1 * | 2/2011 | Nunes et al. | 118/58 |
| 2011/0048328 A1 * | 3/2011 | Carcia et al. | 118/728 |
| 2011/0059245 A1 * | 3/2011 | Miyamoto et al. | 427/345 |
| 2011/0059574 A1 * | 3/2011 | Miyamoto et al. | 438/95 |
| 2011/0086167 A1 * | 4/2011 | Nunes et al. | 427/249.17 |
| 2011/0132874 A1 * | 6/2011 | Gottscho et al. | 216/67 |
| 2011/0200741 A1 * | 8/2011 | Fukao et al. | 427/66 |
| 2012/0085366 A1 * | 4/2012 | Hirota | 134/1.1 |
| 2012/0142197 A1 * | 6/2012 | Endo et al. | 438/758 |
| 2012/0149180 A1 * | 6/2012 | Endo et al. | 438/514 |
| 2012/0238075 A1 * | 9/2012 | Miyamoto et al. | 438/478 |

* cited by examiner

MULTI-REGION PROCESSING SYSTEM

CLAIM OF PRIORITY

This application is a Divisional application of U.S. application Ser. No. 11/965,689 filed Dec. 27, 2007, with a Notice of Allowance dated Apr. 12, 2011 which is incorporated by reference in its entirety for all purposes. This application claims the benefit of U.S. application Ser. No. 60/970,500 filed Sep. 6, 2007, which is incorporated by reference in its entirety for all purposes.

BACKGROUND OF THE INVENTION

Semiconductor processing operations include forming layers through deposition processes as well as removing layers, defining features (e.g., etch), preparing layers (e.g., cleans), doping or other processes that do not require the formation of a layer on the substrate. In addition, similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner.

While gradient processing has attempted to provide additional information, the gradient processing suffers from a number of shortcomings. Gradient processing relies on defined non-uniformity which is not indicative of a conventional processing operation and therefore cannot mimic the conventional processing. In addition, under gradient processing, a moving mask or shutter is generally used to deposit different amounts of material (or dopant) across the entire substrate or a portion of the substrate. This approach is also used for a deposition system having a carousel of targets which may or may not be used for co-sputtering purposes. In each of these systems, the uniformity of the region being deposited, as well as cross contamination issues when performing more than one deposition process render these techniques relatively ineffective for combinatorial processing.

Thus, an improved technique for accommodating the evaluation of multiple different process variations on a single substrate is provided to more efficiently evaluate the viability of different materials, unit processes, or process sequences.

SUMMARY OF THE INVENTION

Embodiments of the present invention provide a deposition system and method for combinatorial processing. Several inventive embodiments of the present invention are described below.

In one aspect of the invention, a deposition system having a radially articulating process head disposed within the deposition system is provided. The radially articulating process head is capable of depositing a layer of material onto regions of a substrate. In one embodiment, the regions are site isolated regions of the substrate. The deposition system may include multiple radially articulating deposition heads disposed over a substrate surface. In order to have access to the entire substrate surface, the support on which the substrate rests is configured to rotate or linearly move the substrate. The process head is capable of being used for cold plasma operations where a base of the depositions head acts as a cathode and a shield surrounding a sidewall extending from the base acts as an anode. In another embodiment, a showerhead of the deposition head is adjustable relative to a distance from a substrate surface. That is, the showerhead is adjustable in a z-direction independent of the movement of the deposition head in order to adjust a process volume.

In another aspect of the invention, a process head has concentrically placed conduits configured to deliver a deposition fluid to a surface of a substrate through an inner conduit and provide exhaust for the deposition fluid through a cavity defined between an outer wall of the first conduit and an inner wall of the second conduit. In one embodiment, the bottom surface of the inner conduit and the bottom surface of the second conduit are co-planar. The process head optionally includes a third conduit surrounding the second conduit. The third conduit provides a fluid barrier preventing the deposition fluid from flowing outside a perimeter of the third conduit. In one embodiment, the fluid acting as the fluid barrier is exhausted through the second conduit. The first, second and third conduits may be concentric around a common axis.

In yet another aspect of the invention, methods for site isolated deposition are provided. The methods deposit regions of material onto a substrate through the process heads described herein. In one embodiment, a gaseous deposition fluid flows through an inner conduit disposed over a portion of a substrate. Contemporaneously, a vacuum may be applied to a defined cavity surrounding the inner conduit to withdraw fluid across a bottom surface of the inner conduit and into the defined cavity. A containment fluid may optionally flow through an outer conduit surrounding both the inner conduit and the region encompassing the inner conduit in one embodiment. A film is deposited onto the portion or region of the substrate and this may be repeated for another portion or region of the substrate. In another embodiment, a method for depositing a film on a site isolated region of a substrate is provided. In this embodiment, a showerhead within a showerhead assembly is moveable so as to adjust a volume of a processing region defined between the showerhead assembly and the site isolated region of the substrate. A deposition fluid flows through the adjusted showerhead to deposit a film on the site isolated region of the substrate. In one embodiment, excess deposition fluid and deposition by-products are removed by providing vacuum to a confined area surrounding the showerhead assembly. Accordingly, through the embodiments described herein multiple sites on a substrate may be combinatorially processed, either in parallel, serially, or a combination of parallel and serially, to provide data on alternative process sequences, material, process parameters, etc.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 7-1 is a simplified schematic diagram illustrating a bottom surface of an outer ring of the process head of FIG. 7 in more detail.

DETAILED DESCRIPTION

Figure 1:
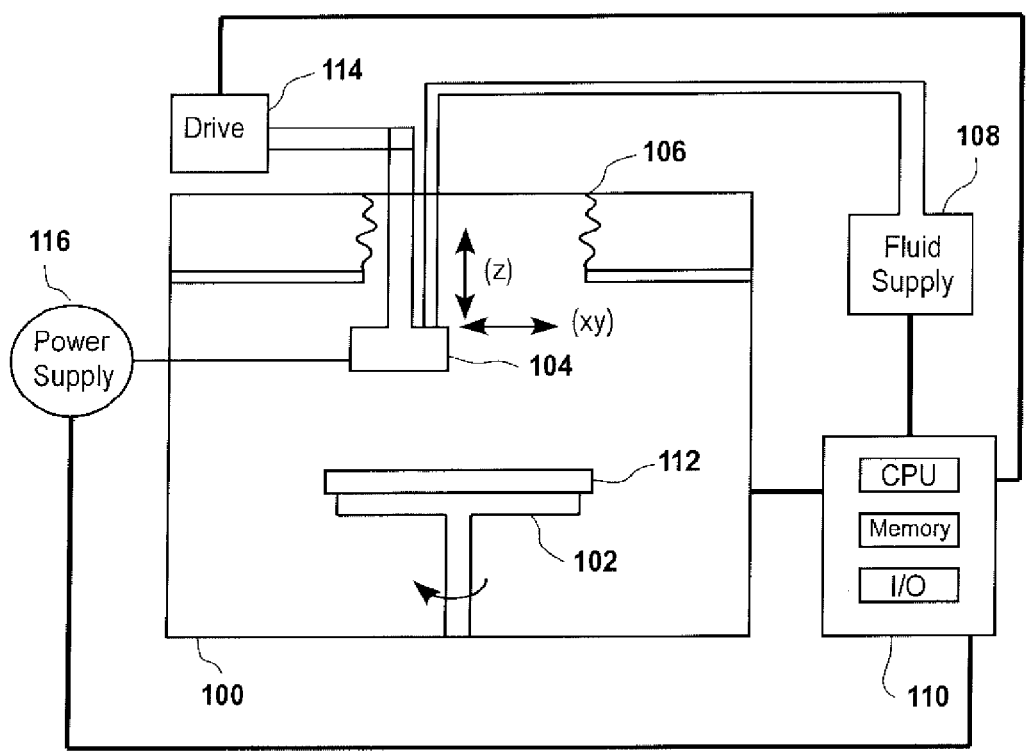
FIG. 1 is a simplified schematic diagram illustrating a processing chamber in accordance with one embodiment of the invention.

The embodiments described herein provide a method and system for processing of a substrate in a combinatorial manner. It will be apparent, however, to one skilled in the art, that the present invention may be practiced without some or all of these specific details. In other instances, well known process operations have not been described in detail in order not to unnecessarily obscure the present invention.

The embodiments described below provide details for a multi-region processing system and associated process heads that enable processing a substrate in a combinatorial fashion. Thus, different regions of the substrate may have different properties, which may be due to variations of the materials, unit processes (e.g., processing conditions or parameters) and process sequences, etc. Within each region the conditions are preferably substantially uniform so as to mimic conventional full wafer processing within each region, however, valid results can be obtained for certain experiments without this requirement. In one embodiment, the different regions are isolated so that there is no inter-diffusion between the different regions.

In addition, the combinatorial processing for a substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial deposition processing and return the substrate to the manufacturing process flow for further processing. Alternatively, the substrate can be processed in an integrated tool, e.g., a cluster tool, that allows both combinatorial and conventional processing in various chambers attached around a central chamber. Consequently, in one substrate information concerning the varied processes and the interaction of the varied processes with conventional processes can be evaluated. Accordingly, a multitude of data is available from a single substrate for a desired process.

The embodiments described herein are directed to various applications, including deposition, which includes physical vapor deposition (PVD), chemical vapor deposition (CVD), atomic layer deposition (ALD), reactive ion etching (RIE), cold plasma depositions, as well as other applications, such as etch, doping, surface modification or preparation (e.g., cleaning processes or monolayer depositing), etc. It should be further appreciated that the embodiments described below are techniques optimized for combinatorial processing of a substrate. The movement of a relatively small (as compared to the overall area of the substrate) region defined through a processing head, along with the rotation of the substrate enables access to the entire surface of the substrate. Alternatively, the processing head may be rotated in a circular fashion and the substrate may be moved in a relative x-y direction to enable access to the entire surface by the processing head. In other embodiments, both the processing head and the substrate may be rotated around an axis, where the axis may or may not be a common axis, or the processing head and the substrate may both move in a linear (XY plane) manner. A single head or multiple heads may be included on a moveable arm that can radially scan across a surface of the substrate to enable serial (one head at a time), serial-parallel or fast serial (multiple heads at once that repeat processing to cover the various regions on the substrate) or parallel (using sufficient heads to process all of the regions at once) processing. In the parallel processing embodiment, the rotation enables different processing by region through the rotation wherein each processing head implements a different process over a different region, or as another alternative, the same process is implemented in each processing head with reliance on the rotation of the substrate to create differently processed regions on the substrate.

In one embodiment, a moveable head is configured to create a plasma in an isolated region, which may be referred to as a processing region, above the substrate thereby avoiding the need for masking. While masking is generally not required, the various aspects of the invention also work with masks and may in some situations improve the isolation capability and tolerances mentioned below. In another embodiment, a moveable head configured to enable site isolated ALD for a substrate is provided. One skilled in the art will appreciate that ALD, CVD, and PVD are not limited to deposition processes. For example, ALD can be used to perform a doping process in one embodiment. More particularly, by depositing one monolayer or less per deposition cycle, the ALD process can be used as a form of doping. In another embodiment, the PVD and/or ALD processes can "etch". One skilled in the art will appreciate that by changing process gases, e.g., where a process gas reacts with the substrate, an etch process may be performed, as compared to a process gas that deposits material onto the substrate.

FIG. 1 is a simplified schematic diagram illustrating a reaction chamber in accordance with one embodiment of the invention. Reaction chamber 100 includes substrate support 102 and process head 104. Substrate support 102, which may be an electrostatic chuck or other chuck, is configured to rotate. In another embodiment, substrate support 102 may move linearly within chamber 100. Process head 104 is configured to articulate in a linear direction radially above a surface of substrate 112, which is disposed on substrate support 102. In one embodiment, processing head 104 may move in two dimensions in the plane above substrate 112. In another embodiment, bellows 106 provides a seal to maintain the integrity of the chamber as process head 104 articulates. One skilled in the art will appreciate that by configuring substrate support 102 to rotate at least 180 degrees and having process head 104 capable of moving across a radius of substrate 112, all positions over substrate 112 are accessible to process head 104 for combinatorial processing. In one embodiment, substrate support 102 rotates at least 185 degrees to ensure complete coverage. In another embodiment, substrate support 102 rotates 360 degrees. In addition to moving in a linear direction parallel to a surface of substrate 112, deposition head 104 can move in a Z direction orthogonal to the surface of a substrate resting on substrate support 102 in order to place the head over the region to be processed and/or vary the height of the process head to the substrate, which in turn varies a volume of the processing region, as described further below. In this manner process head 104 may be used to adjust a process volume defined between a process head and a surface of the substrate.

Fluid supply 108 is configured to deliver fluids to process head 104. In essence, fluid supply 108 delivers process gases suitable for any deposition process executed through process head 104. Of course, to accommodate the movement of process head 104, the delivery lines from fluid supply 108 may be flexible. Drive 114 provides for the linear (X Y) and orthogonal (Z) movement of process head 104 within reaction chamber 100. One skilled in the art will appreciate that drive 114 may be any suitable drive, such as a linear drive, worm gear, etc. In addition, drive 114 or a separate drive may control the orthogonal movement, which is independent of the linear movement. Exemplary drives may include linear slides driven by stepper motors on lead screws, pneumatics drives, servo drives, rack and pinions assemblies, etc. In order to create a plasma, power source 116, e.g., radio frequency (RF), DC pulsed, microwave, etc., is coupled to process head 104. Controller 110, which includes a central processing unit (CPU), memory, and input/output capability, controls the processing within chamber 100. In one embodiment, a recipe contained within the memory of controller 110 will be executed by the CPU for processing within chamber 100. Controller 110 is configured to control power supply 116, drive 114, fluid supply 108, and other aspects of the reaction chamber for the combinatorial processing operations. In another embodiment, separate controllers may be utilized for each component and a general purpose computer can control the operation of the separate controllers through a processing recipe.

Figure 2:
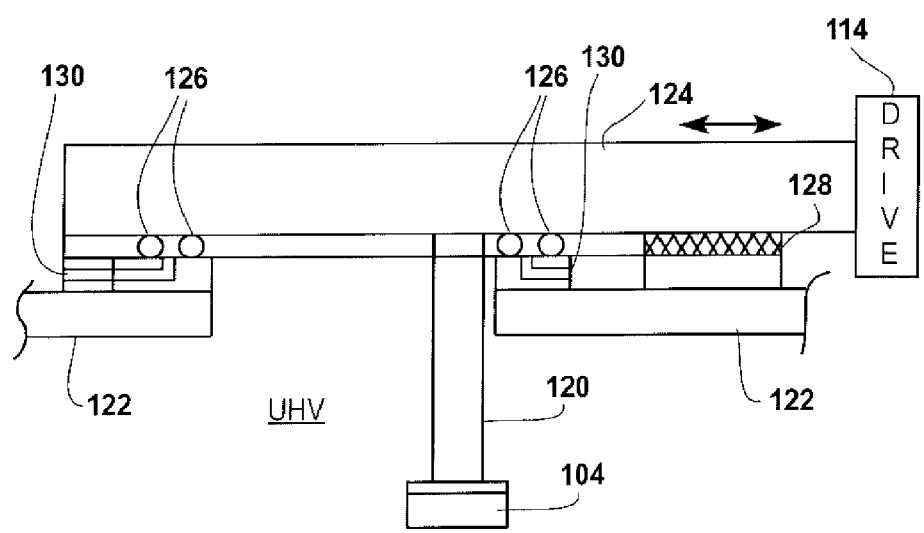
FIG. 2 is a simplified schematic diagram showing additional details for movement of the articulating head in accordance with one embodiment of the invention.

FIG. 2 is a simplified schematic diagram showing additional details for movement of the articulating process head in accordance with one embodiment of the invention. In FIG. 2, an alternative sealing mechanism from the bellows of FIG. 1 is provided. Within FIG. 2 process head 104 is supported by arm 120 (also referred to as a post) which is affixed to moveable top plate 124. In one embodiment, arm 120 extends through top plate 124 and an end of the arm is connected to a drive that provides Z-direction movement. A seal is maintained between arm 120 and moveable top plate 124 to maintain the integrity of the processing chamber as the arm lifts and lowers relative to a surface of the substrate and otherwise moves. Moveable top plate 124 may be slideably disposed over bearing support surface 128 and o-rings 126. Bearing support surface 128 is a surface disposed on chamber top 122 which guides moveable top plate 124 so as not to cause excessive pressure on o-rings 126. While one bearing surface is illustrated in FIG. 2, another bearing surface may be provided across the opening of chamber top 122 in order to support moveable top plate 124 on both sides of the opening. The bearing surface may consist of ball bearings, pneumatics, hydraulics, etc. In one embodiment, the chamber is at an ultra high vacuum, e.g., $10^{-8}$ or $10^{-9}$ torr, while the region between o-rings 126 is pumped down to a milliTorr vacuum range. The pumping of the space between o-rings 126 can be accomplished through channel 130 that enables access for a pump to the space defined between o-rings 126. For example, channel 130 may be drilled through the upper plate of the chamber to enable access to pump the space defined between o-rings 126.

Figure 3:
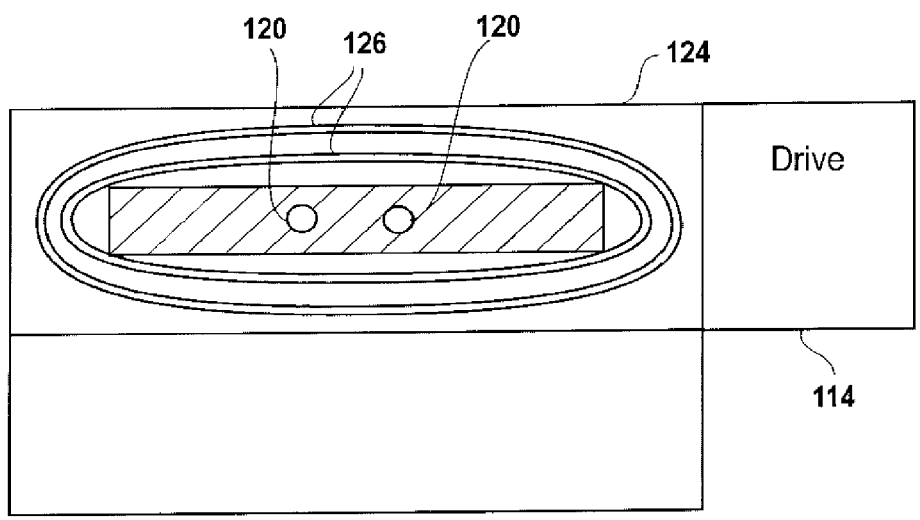
FIG. 3 is a top view of the chamber of FIG. 2 in accordance with one embodiment of the invention.

FIG. 3 is a top view of the chamber of FIG. 2 in accordance with one embodiment of the invention. In FIG. 3, top movable plate 124 includes posts 120 for supporting a process head within the chamber. While there are two posts 120 for slideable moveable plate 124 in FIG. 3, it should be appreciated that any number of posts and corresponding process heads may be disposed on the slideable plate. O-rings 126 provide a seal between the vacuum of the chamber and the outside atmosphere. Drive 114 for moveable plate 124 may include any suitable linear drive, worm gear, etc. in order to articulate the posts 120 and corresponding deposition head for movement above a surface of a wafer for the combinatorial processing. Additional drives connected to the top of posts 120 for the Z-direction movement are not shown for ease of illustration. The process head 104 (not shown) can be any number of different process heads directed to various applications, including deposition operations, which includes physical vapor deposition (PVD), chemical vapor deposition (CVD), atomic layer deposition (ALD), and other applications, such as etch, doping, surface modification or preparation (e.g., cleaning processes or monolayers depositing), etc. Several different embodiments of the process head are described in more detail below.

Figure 4A:
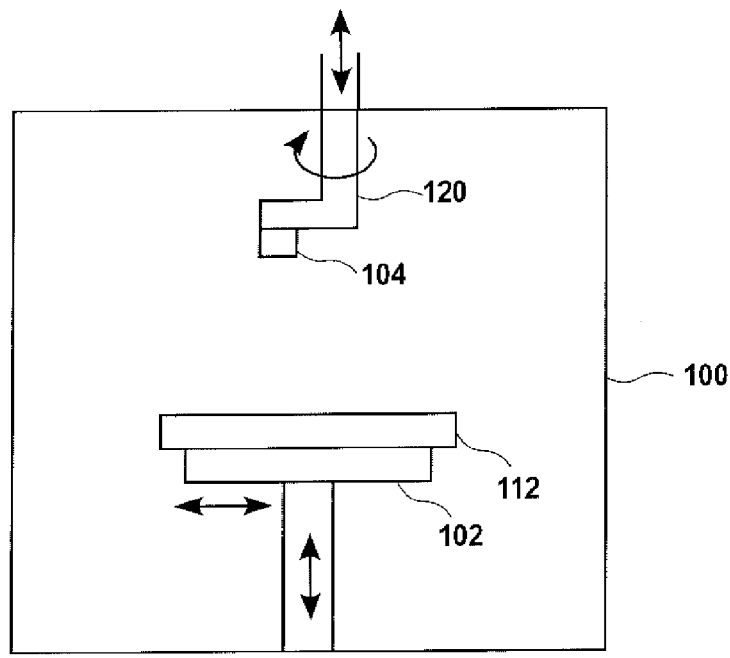
FIG. 4A is a simplified schematic diagram of a system having a rotatable processing head and a moveable substrate support in accordance with one embodiment of the invention.

FIG. 4A is a simplified schematic diagram of a system having a rotatable processing head and a moveable substrate support in accordance with one embodiment of the invention. Process head 104 is supported by arm 120 within clamber 100. Arm 120 is configured to move in a vertical direction (Z articulation) and rotate about an axis. An axis of process head 104 is offset from the axis of rotation around which process head 104 rotates. Substrate 112 is disposed on substrate support 102. Substrate support 102 is configured to move in a vertical direction (Z articulation) as well as linear articulation in an XY plane. In this manner, isolated regions of substrate 112 may be combinatorially processed. In one embodiment, multiple process heads may be attached to arm 120. In another embodiment, multiple arms may be provided within chamber 100.

Figure 4B:
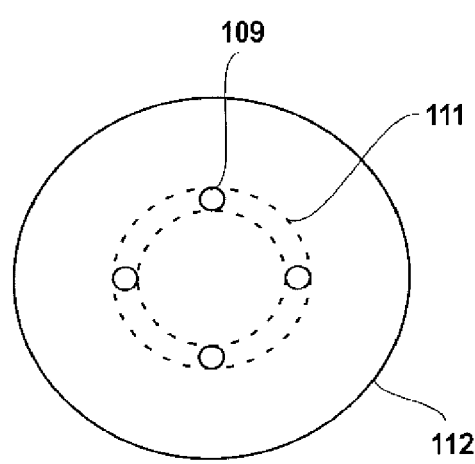
FIG. 4B is a simplified schematic diagram illustrating one exemplary combinatorial region pattern enabled through the embodiment of FIG. 4A.

FIG. 4B is a simplified schematic diagram illustrating one exemplary combinatorial region pattern enabled through the embodiment of FIG. 4A. Substrate 112 has isolated regions 109 defined thereon. Isolated regions 109 may be regions that are combinatorially processed where one of or a combination of materials, unit processes or a process sequence is varied across the regions. As illustrated in FIG. 4B track 111 is one exemplary path followed by process head 104 of FIG. 4A. However, one skilled in the art will appreciate that the embodiments described herein will enable numerous other patterns through the rotational movement of process head 104 and planar movement of substrate support 102, such as the exemplary pattern shown in FIG. 8.

Figure 5A:
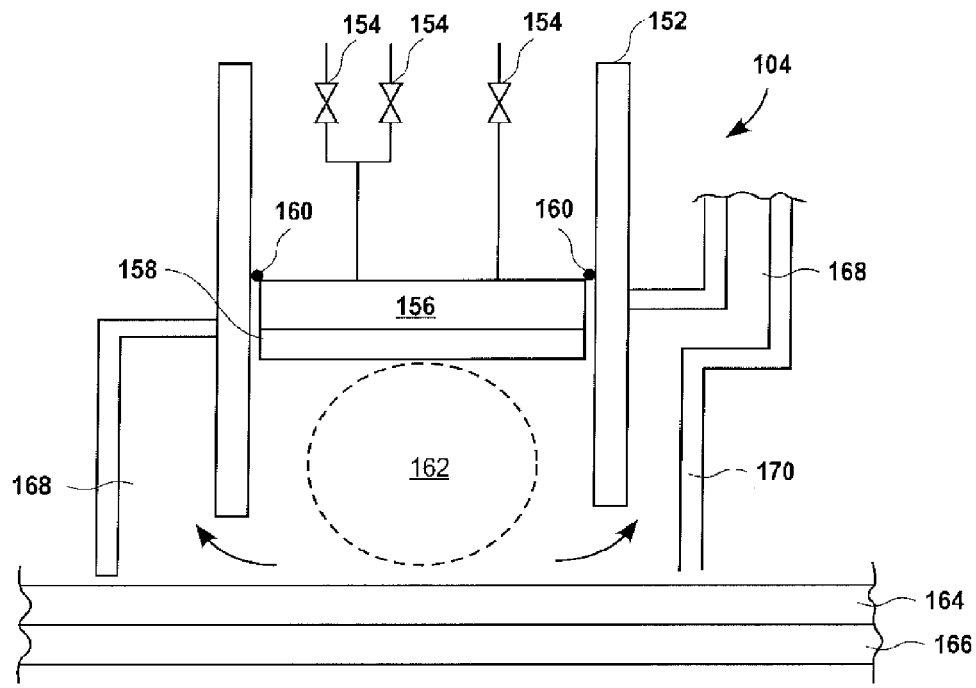
FIG. 5A is a simplified schematic diagram illustrating a process head configured for combinatorial processing in accordance with one embodiment of the invention.
Figure 5B:
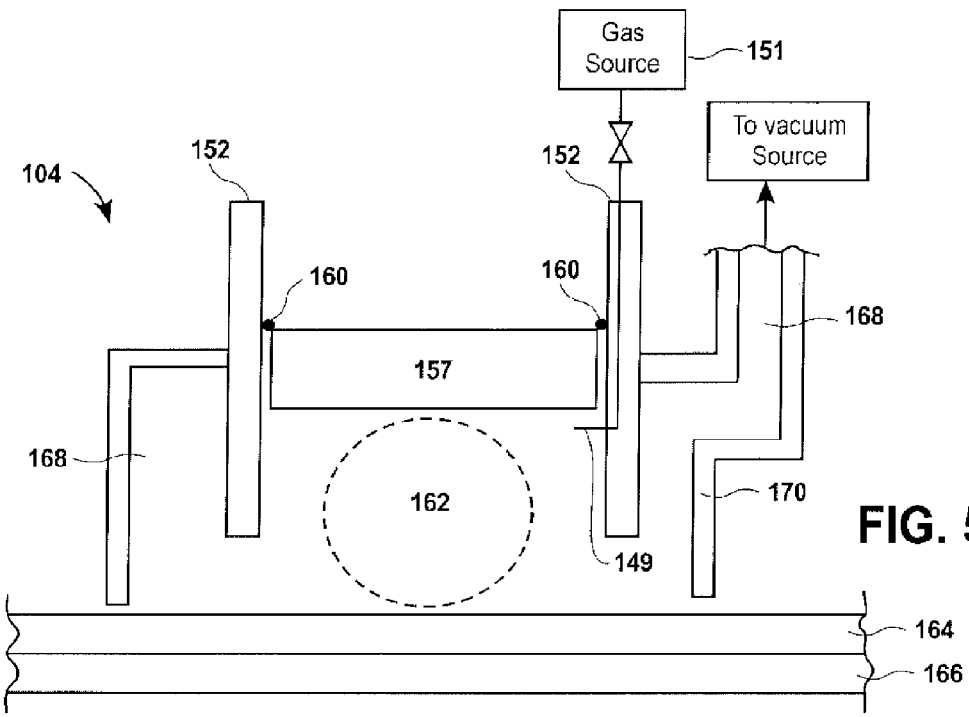
FIG. 5B illustrates a processing head that may be utilized for a physical vapor deposition (PVD) process in accordance with one embodiment of the invention.

FIGS. 5A and 5B illustrate simplified schematic diagrams of a process head configured for combinatorial processing in accordance with embodiments of the invention. Process head 104 can enable several dry processes, including plasma based systems (e.g., PVD, its variants, or cold plasma) as illustrated in FIG. 5B or other gaseous fluid based systems (e.g., ALD or CVD, or similar variants) as illustrated in FIG. 5A. While these types of heads are explained in detail, other heads that support additional processing schemes can be adapted from these heads or can replace these heads. Process head 104 is a cylindrical shape in accordance with one embodiment, but can be any other geometric shapes, such as quadrilateral, oval, pentagon, etc. The process region on the substrate, also referred to as a site isolated region, can be defined by the reaction chamber, e.g., on a blanket or patterned substrate through the process head, or the process region can be pre-defined on the substrate (e.g., through test structures, die, multiple die or other techniques).

As shown in FIG. 5A, sidewall 152 defines an outer wall of the process or deposition head and in a top region of process head 104, valves 154 provide fluid to plenum 156, which distributes the fluid to showerhead 158. The combination of showerhead 158 and plenum 156 may be referred to as a showerhead assembly or process head assembly. A seal between the showerhead assembly and sidewall 152 is provided by o-ring 160, which also enables movement of the showerhead assembly without breaking the vacuum. The showerhead assembly can also be permanently affixed to sidewall 152 in one embodiment. In this embodiment sidewall 152 can be moveably sealed with outer wall 170, e.g., through an o-ring or other suitable seal enabling slideable translation to allow for movement in the z-direction. Vacuum may be applied through outer region 168 in order to remove process by-products from processing region 162. Plenum 156 and showerhead 158 may both be moveable in a vertical direction relative to a surface of substrate 164 in order to change a processing volume within process region 162. As the showerhead assembly moves, outer shield 170 and sidewall 152 remain stationary so as to provide a barrier to isolate the deposition to a region of substrate 164. Of course, sidewall 152 may be moveable with the showerhead assembly being either stationary or moveable. In an alternative embodiment, inert gas, e.g., argon, nitrogen, etc. may be fed into an annular space 168 to help maintain isolation of the processing to region 162, defined between sidewall 152, the showerhead assembly and a top surface of the substrate. In this alternative embodiment, exhaust would be provided through another mechanism, such as another opening, e.g., portals in the showerhead assembly, or other suitable techniques.

FIG. 5B illustrates a processing head that may be utilized for a PVD process in accordance with one embodiment of the invention. Process head 104 includes similar features as described with regard to FIG. 5A and for the sake of redundancy some of these features will not be described again in detail. Process head assembly 157 may include a target for the PVD process while gas inlet 149 delivers the process gas from gas source 151 for the PVD processing. A plasma can be struck within region 162 in order to deposit material on a surface of substrate 164, which is disposed over electrostatic chuck 166, or other known substrate supports. One skilled in the art will appreciate that the plasma within region 162 may be sustained by direct current (DC), DC pulsed, radio frequency (RF), inductive coupling, microwave, etc. A cavity, also referred to region 168, defined within outer shield 170 is maintained at a lower pressure than the plasma region deposition chamber in the plasma to entrap or collect the unused or reacted materials and gases.

In one embodiment, a center cathode is contained within process head 104, e.g., a base of process head assembly 157 functions as a cathode, and outer shield 170 would function as an anode, e.g., when performing a cold plasma processing operation, where a stable gas plasma jet is generated near room temperature at atmospheric pressure. In this embodiment, a vacuum is not necessary within the plasma region. In addition, it should be apparent that in one embodiment, a vacuum need not be applied to cavity 168 within outer shield 170 as the entire chamber 100 may be at an appropriate operating pressure and outer shield 170 prevents processing materials from spreading outside of process head 104 into the main chamber to avoid impacting other regions. Outer shield 170 may be electrically floating or grounded as required by the combinatorial processing.

In yet another embodiment, outer shield 170 may be resting against a top surface of substrate 164 in order to provide a seal against a top surface of the substrate to isolate a region of the substrate for processing and prevent inter-diffusion of deposition materials between regions. Of course, outer shield 170 may move orthogonally relative to the surface of substrate 164 so that a volume of region 162 may be modified. In addition, the substrate support may move the substrate vertically, as well as rotate the substrate in one embodiment. Thus, the volume of region 162 is adjustable through numerous techniques under the embodiments described herein.

Figure 6:
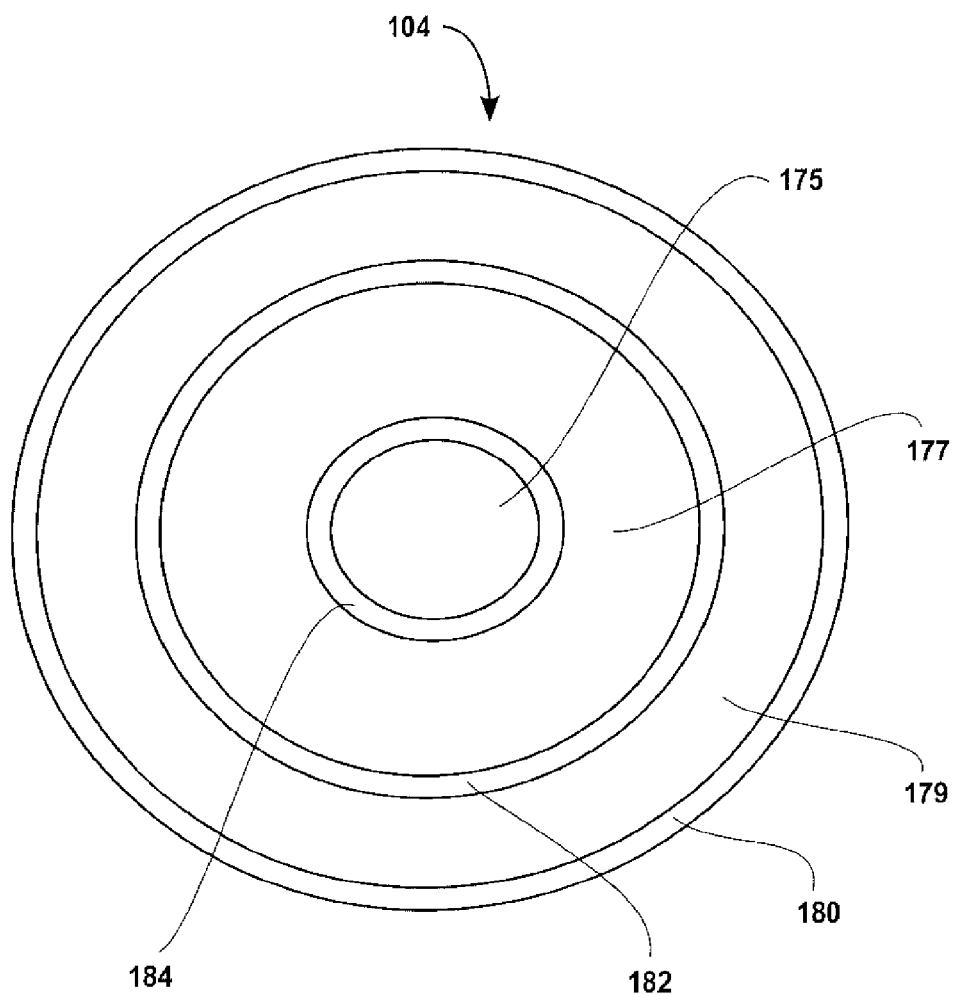
FIG. 6 is a top view of a process/deposition head for combinatorial processing in accordance with one embodiment of the invention.

FIG. 6 is a top view of a process/deposition head for combinatorial processing in accordance with one embodiment of the invention. Process head 104 includes two or optionally three concentric rings. An optional outer ring 180 surrounds an intermediate ring 182 which in turn surrounds inner ring 184, also referred to as a conduit. As will be described in more detail with reference to FIG. 7, the region defined within inner ring 184 flows a process gas over a region of a substrate disposed below in order to deposit a layer on a portion of the substrate during combinatorial processing operations. In one embodiment, the region within inner ring 184 is about 43 millimeters in diameter to accommodate typical test die sizes, but can be any size based on known test die or other design parameters. The region defined between intermediate ring 182 and inner ring 184 is used to evacuate or pump gas out from the deposition area defined within inner ring 184. That is, a vacuum source may be connected to evacuate the area between an inner surface of intermediate ring 182 and an outer wall of the conduit for inner ring 184.

The region between optional outer ring 180 and intermediate ring 182 may be used to flow inert gas, e.g., argon, in order to contain the products and prevent contamination to other regions of the substrate disposed below the deposition head. If ring 180 is not included, the vacuum in the annular space defined by ring 182 and 184 prevents the process being performed in the regions defined by process head 104 from impacting other regions on the wafer. While some gases or other fluids may escape, the amount of gas escaping will not impact the experimentation. If ring 180 is not included, then regions on the substrate may be spaced further apart than if this additional layer of protection is provided within the process head itself. In one embodiment, the region between an inner surface of intermediate ring 182 and an outer surface of inner ring 184 is approximately between one and ten millimeters. In another exemplary embodiment, the thickness of each of the concentric rings is approximately one to five millimeters. However, these embodiments are not meant to be limiting as the thickness and distances between the rings may be any suitable thickness dependent upon the application and processing being performed. The material of construction may be any material suitable for deposition processes, such as stainless steel and aluminum.

Figure 7:
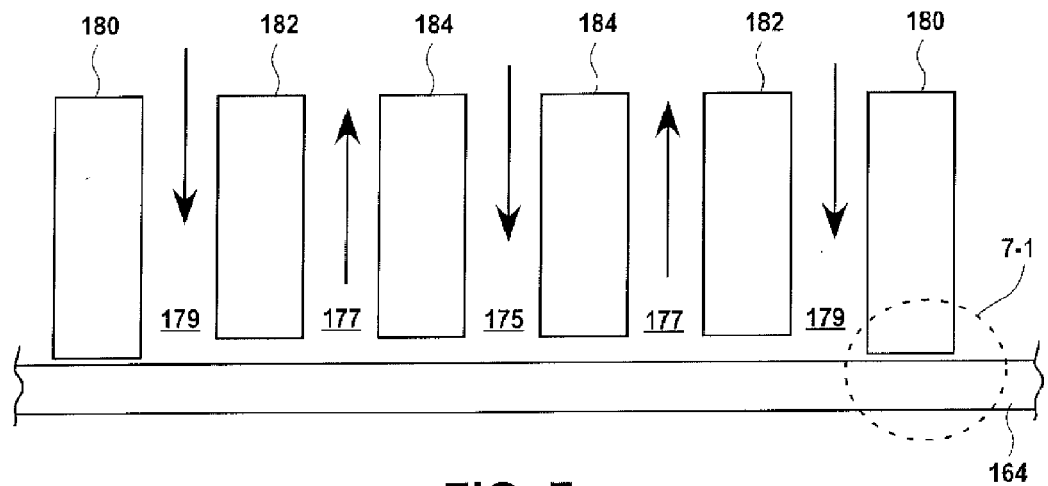
FIG. 7 is a simplified schematic diagram illustrating a cross sectional view of the process head of FIG. 6.
Figures 1, 7:
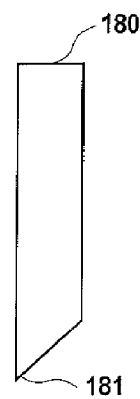

FIG. 7 is a simplified schematic diagram illustrating a cross sectional view of the process head of FIG. 6. In FIG. 7, outer ring 180 preferably has less separation with the substrate than rings 182 or 184 and may contact the surface of substrate 164. As set forth above, optional outer ring 180 provides extra protection against leakage from the processing region to other regions of the substrate than when only rings 182 and 184 are included. As illustrated in FIG. 7, a process gas would flow within inner ring 184 and be evacuated through the intermediate space between intermediate ring 182 and inner ring 184. Thus, gas would flow towards substrate 164 within area 175 defined by inner ring 184, under ring 184 and be evacuated by a vacuum acting within the area defined by inner ring 184 and intermediate ring 182. The process region is defined by inner ring 184, while intermediate ring 182 and optional outer ring 180 provide buffer zones. The process volumes defined below the bottom surfaces of inner ring 184 and a top surface of the substrate is adjustable by moving the process head vertically.

If outer ring 180 is not included, intermediate ring 182 may be closer to the substrate than inner ring 184, however this is optional. Alternatively, the intermediate ring can be touching substrate 164 in one embodiment. The spacing between ring 182 and substrate 164 may allow processing fluid (e.g., gases) to escape. To further protect against that, argon or some other inert gas may be used to flow within the outer most cavity or annular space 179 in order to further contain the processing byproducts. This inert gas would flow towards substrate 164 in the outer cavity 179, under ring 182 and be evacuated by the vacuum in area 177 between inner ring 184 and intermediate ring 182. The inert gas will not impact the processing within inner ring 184 and the flow rate should be chosen to minimize any such diffusion into that region. As mentioned above, the materials used for the process head can be stainless steel, aluminum, or any other suitable metal compatible with the plasma and gases used for the processing and deposition of layers on semiconductor wafers. Where the surfaces of the deposition head contact a surface of the substrate, a polytetrafluoroethylene, such as TEFLON™ coating or some other suitable non-reactive coating may be used on the surface of the process head that contacts the surface of substrate 164. In one embodiment, the bottom surface of outer ring 180 is a knife edge to minimize the contact area with substrate 164. FIG. 7-1 illustrates a bottom surface of outer ring 180 where the bottom edge 181 is configured as a knife edge.

Figure 8:
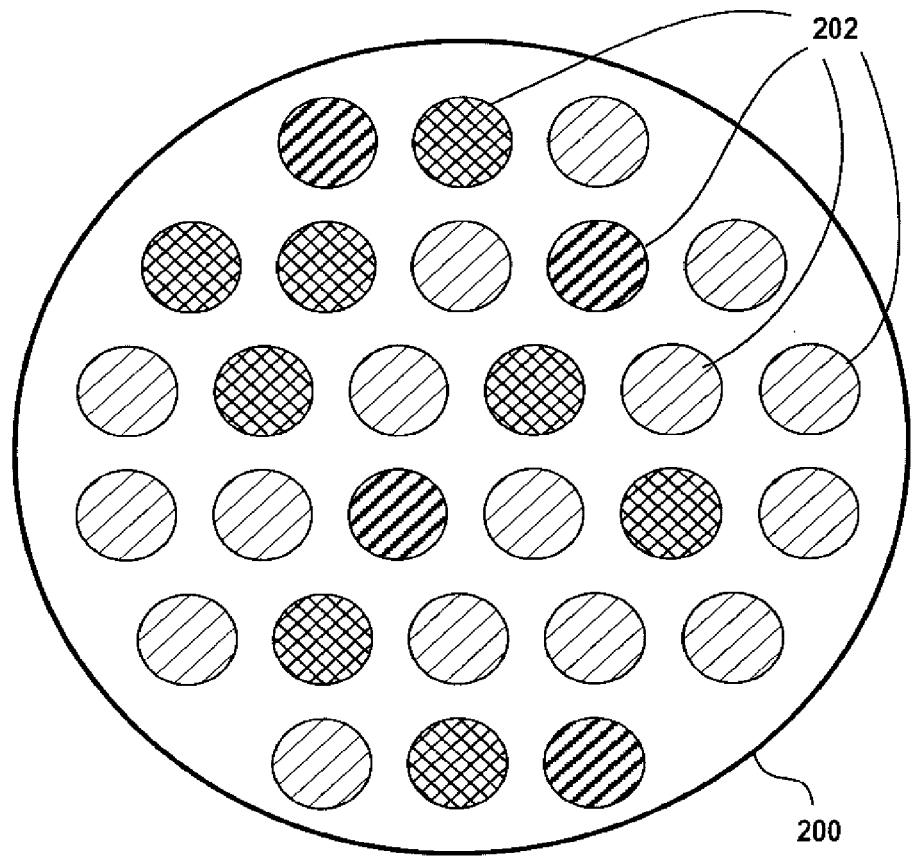
FIG. 8 is a simplified schematic diagram of a substrate that has been combinatorially processed with isolated regions in accordance with one embodiment of the invention.

FIG. 8 is a simplified schematic diagram of a substrate that has been combinatorially processed with isolated regions in accordance with one embodiment of the invention. Substrate 200 includes a plurality of regions 202 disposed thereon. Each of regions 202 is processed with one of the process heads in the chamber(s) described above. Through the use of a linearly, radially articulating arm and the rotation provided by a substrate support (or rotation of the head and linear (x-y) movement of the substrate, or rotation of both the head and the substrate, or linear movement of both the head and the substrate) any pattern of site isolated deposition areas may be defined on the surface of substrate 200. The pattern shown is symmetric and enables the greatest use of the substrate and easiest alignment of the heads, however, other patterns or numbers of regions can also be implemented. It should be appreciated that on substrate 200 a wealth of knowledge exists on a single substrate as each of regions 202 may have some property or characteristic of the process altered. Thus, the information available for each region as well as the interaction of each region with previous or subsequent process operations or materials may be harvested to provide data on an optimum material, unit process and/or process sequences in a highly efficient manner. While FIG. 8 illustrates regions 202 as isolated and not overlapping, the regions may overlap in one embodiment. In another embodiment a region refers to a localized area on a substrate which is, was, or is intended to be used for processing or formation of a selected material. The region can include one region and/or a series of regular or periodic regions pre-formed on the substrate. The region may have any convenient shape, e.g., circular, rectangular, elliptical, wedge-shaped, etc. In one embodiment, the regions are predefined on the substrate. However, the processing may define the regions in another embodiment.

Figure 9:
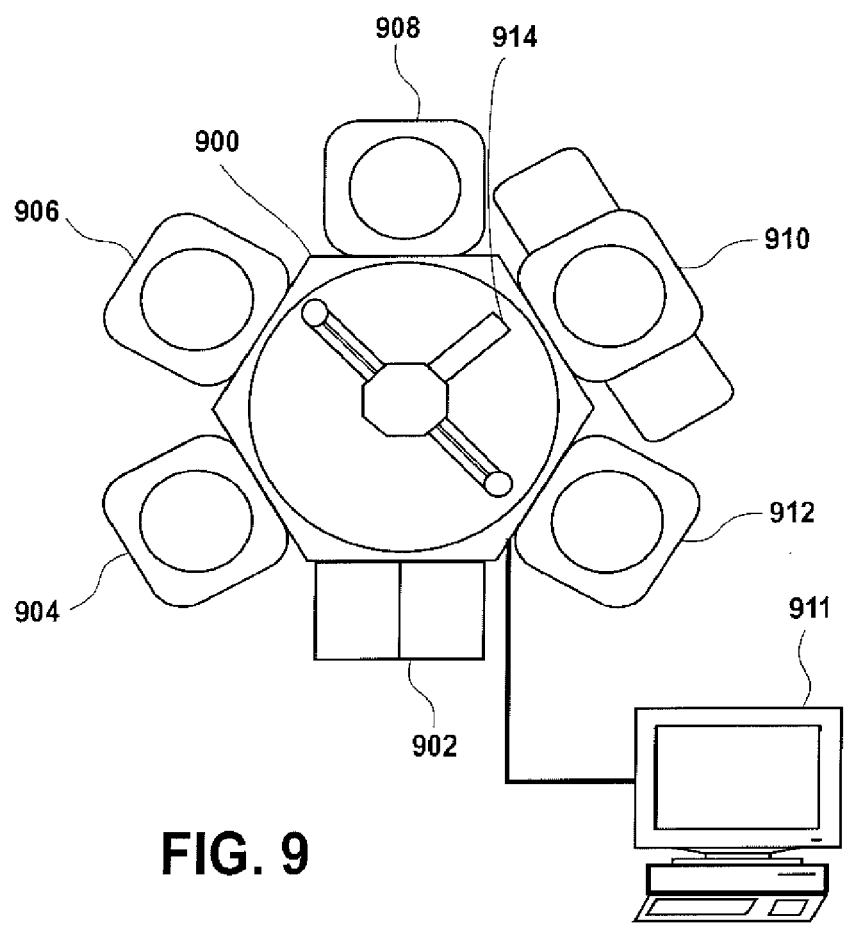
FIG. 9 a simplified schematic diagram illustrating an integrated high productivity combinatorial (HPC) system having a process head configured for combinatorial processing in a process chamber of the system in accordance with one embodiment of the invention.

FIG. 9 is a simplified schematic diagram illustrating an integrated high productivity combinatorial (HPC) system in accordance with one embodiment of the invention. HPC system includes a frame 900 supporting a plurality of processing modules. It should be appreciated that frame 900 may be a unitary frame in accordance with one embodiment. In one embodiment, the environment within frame 900 is controlled. Load lock/factory interface 902 provides access into the plurality of modules of the HPC system. Robot 914 provides for the movement of substrates (and masks) between the modules and for the movement into and out of the load lock 902. Module 904 may be an orientation/degassing module in accordance with one embodiment. Module 906 may be a clean module, either plasma or non-plasma based, in accordance with one embodiment of the invention. Any type of chamber or combination of chamber may be implemented and the description herein is merely illustrative of one possible combination and not meant to limit the potential chamber or processes that can be supported to combine combinatorial processing or combinatorial plus convention processing of a substrate/wafer.

Module 908 is referred to as a library module in accordance with one embodiment of the invention. In module 908, a plurality of masks, also referred to as processing masks, are stored. The masks may be used in the dry combinatorial processing modules in order to apply a certain pattern to a substrate being processed in those modules. Module 910 includes a HPC physical vapor deposition module in accordance with one embodiment of the invention. Module 912 is a deposition module, e.g., an ALD or CVD module. Modules 910 and/or 912 may include the process heads described herein. It should be appreciated that modules 910 and 912 may be configured to include multiple process heads where the process heads are all similar, such as the process heads of FIG. 5A, 5B, or 6, or some combination of different process heads described herein. In addition, the multiple process heads may be used to perform the same or different process operations on a substrate being processed within the process module. For example, where different process heads are within a process module, some process heads may perform ALD operations, some process heads may perform PVD operations and so on. In addition, process heads performing the same operation may vary the processing conditions, parameters, materials, etc. These multiple different operations may be performed in parallel or serially. Accordingly, numerous combinations of experiments may be performed on site isolated regions of a single substrate through the combinatorial processing embodiments with the moveable processing heads described herein. In one embodiment, a centralized controller, i.e., computing device 911, may control the processes of the HPC system. Further details of the HPC system are described in U.S. patent application Ser. Nos. 11/672,478, and 11/672,473. With HPC system, a plurality of methods may be employed to deposit material upon a substrate employing combinatoric processes.

In summary, the embodiments described above may enable combinatorial processes to be applied to a substrate in a site isolated manner either in parallel, serial-parallel or serial manner. A process head is disposed within a chamber and opposing a substrate surface can scan radially across the substrate surface. The head is preferably configured to process a portion (e.g., site isolated region) of the substrate in a substantially uniform manner without the use of a mask or shutter, however, a mask may be used in certain embodiments. It should be appreciated that where the substrate is not circular, e.g., a quadrilateral or other shape, the head would preferably scan across a maximum width of the quadrilateral, while the substrate is rotated to provide complete access, but need not be so set up. In addition, the head can move linearly in combination with orthogonal movement of the substrate to minimize the overall the chamber size. The movement of the head is performed in a manner that maintains the integrity of the processing chamber. It should be appreciated that the deposition may occur on a blanket substrate or a substrate having structures, patterns, devices or other features defined thereon. In addition the substrate may be further processed through full substrate conventional techniques following the combinatorial deposition techniques described above.

Further embodiments described below include a reaction chamber with a radially articulating process head disposed within the chamber, where the radially articulating deposition head is capable of processing multiple regions of a substrate and where the regions are substantially isolated from each other. The chamber may have multiple process heads and multiple regions may be processed in a serial manner, a fast serial or a parallel manner. It should be appreciated that the inner wall of the process heads may define the regions, while the outer walls provide a seal to isolate the regions. In another embodiment, the regions may be pre-defined on the substrate. The chamber may include a rotatable substrate support under the process head and the substrate support may rotate over approximately half of the substrate, e.g., approximately 185 degrees. The radially articulating process head has a range of movement over a radius of the substrate. In addition, the process head may move vertical relative to a base of the deposition system. The process head is affixed to an arm driving both radial articulation of the head over a top surface of a substrate in the reaction chamber and orthogonal movement of the process head relative to a top surface of the substrate in one embodiment. A differentially pumped seal is defined by a first o-ring surrounded by a second o-ring and a cavity between the first and second o-rings is evacuated to a pressure greater than a pressure within the deposition system and less than an external pressure in order to isolate the chamber form an external surface. The process head includes a base opposing the substrate and a shield surrounding a lower portion of a sidewall extending from the base. In one embodiment the base functions as a cathode and the shield functions as an anode for a cold plasma operation. A lower portion of the process head is encompassed by a containment wall configured to exhaust deposition byproducts during a deposition operation in one embodiment.

In another aspect of the invention, a process head having a first conduit configured to deliver a gas to a surface of a substrate and a second conduit defined partially by an outer wall encompassing the first conduit is provided. The second conduit is configured to provide exhaust for the gas wherein the outer wall of the second conduit acts as a barrier to contain the gas within an inner area defined by the second conduit. The process head may include a third conduit surrounding the second conduit, where the third conduit is configured to provide a fluid barrier preventing the gas from flowing outside a perimeter of the third conduit. The first, second, and third conduits are concentric around a common axis. A bottom surface of the second conduit is closer to the surface of the substrate than a bottom surface of the first conduit in one embodiment. In another embodiment, the bottom surface may contact the substrate. The process head is affixed to an articulating arm inside a reaction chamber where the substrate rotates on a substrate support in one embodiment. A bottom surface of the third conduit extends past bottom surfaces of the first and second conduits in another embodiment. The bottom surface of the third conduit or the second conduit may contact the substrate and may be configured as a knife edge. In one embodiment, the bottom surface of the third conduit is coated with an inert film.

In another embodiment, a moveable process head for site isolated deposition is provided. A moveable assembly that includes the moveable process head, includes an inner wall defining a process region. In one embodiment, multiple processing regions are formed on one substrate; and an outer wall surrounding a bottom portion of an outer surface of the inner wall contains the processing components to the processing region. In one embodiment a bottom surface of the outer wall extends past a bottom surface of the inner wall. In another embodiment the outer wall contacts a surface of a substrate outside a perimeter of an active deposition area during a deposition operation. In this embodiment the outer wall may contact a mask disposed over a substrate. A vacuum source in fluid communication with an opening of the outer wall is included where the opening enables access to a cavity defined between the outer wall and the inner wall. In another embodiment, the assembly is moveable independent of the process head. For example, the process head is moveable in one dimension and the assembly is moveable in one or more dimension in one exemplary embodiment. The moveable assembly may include one of a target, a showerhead or a cold plasma head. The outer wall and the inner wall may move independently from each other in a Z direction. The outer wall contacts a mask disposed over a surface of the substrate in one embodiment.

In another aspect of the invention a method for multi-region processing on a substrate is provided. The method includes flowing a fluid through an inner conduit disposed over a region of the substrate for processing that region and withdrawing fluid from a region encompassing the inner conduit contemporaneously with the flowing. A containment fluid flows through an outer conduit surrounding both the inner conduit and the region encompassing the inner conduit while providing substantially uniform processing to the region on the substrate defined by the inner conduit. The method includes repeating each above mentioned method operations for a different region of the substrate in one of a serial, serial-parallel, or parallel manner and subsequently processing the substrate through a conventional full wafer process. The method can include moving a process head assembly including the inner conduit and the outer conduit so that the inner conduit is disposed over a next portion of the substrate as well as radial articulation of the deposition head and rotation of the substrate. The method can include contacting a surface of the substrate with a bottom surface of the outer conduit. The moving mentioned above includes rotation of the process head and linear movement of the substrate in one embodiment. The regions may be defined by the process head.

In another aspect of the invention, a method for processing a site isolated region of a substrate is disclosed. The method includes modifying a volume of a processing region defined between the showerhead assembly and the site isolated region of the substrate and flowing a deposition fluid through the showerhead. A film is deposited on the site isolated region of the substrate and excess deposition fluid and deposition by-products are removed through an area surrounding the showerhead assembly contemporaneously with the depositing. The volume of the processing region may be adjusted by moving the showerhead assembly relative to a surface of the substrate in one embodiment. A plasma may be generated in the processing region to generate material for depositing onto the surface of the substrate. A vacuum to the area surrounding the showerhead may be applied to contain or remove fluids from the processing region in one embodiment. Each method operation mentioned above may be repeated for a next site isolated region. In one embodiment, the regions are processed similarly or with different spacing between the showerhead and the substrate and wherein the different spacing is determined by one of movement of the showerhead assembly or movement of an inner wall supporting the showerhead assembly within an outer wall surrounding the inner wall in one exemplary embodiment.

In yet another aspect of the invention a reaction chamber that includes a rotating process head disposed within the reaction chamber is provided. The rotating process head rotates about an axis that is different than an axis of the process head and a substrate support configured to support a substrate under the rotating process head. The substrate support is configured to move the substrate in a planar direction orthogonal to the axis of the processing head.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed:

1. A semiconductor processing chamber, comprising:
a substrate support configured to support a substrate; and
a moveable process head disposed within the semiconductor processing chamber;
wherein the moveable process head comprises an inner wall and a moveable assembly disposed within the inner wall,
wherein the moveable process head is moveably attached to an inner surface of the inner wall through a seal enabling slideable translation of the movable process head in a direction perpendicular to the substrate;
wherein a shield is spaced apart from and surrounds at least a lower portion of the inner wall,
wherein a plurality of non-overlapping site isolated process regions can be defined on the substrate by the position of the inner wall relative to the substrate, and each site isolated process region is defined as the area on the substrate within the inner wall,
wherein the shield is operable as a barrier to isolate deposition from the movable process head to a single site isolated region;
wherein the moveable process head is operable to perform a dry process on the site isolated process region,
wherein an enclosed processing region is defined as the volume between the inner wall, the movable process head, and the substrate, and
wherein the enclosed processing region can be evacuated through a circumferential gap below the inner wall contemporaneously with the performing of the dry process.

2. The semiconductor processing chamber of claim 1, wherein the inner wall is moveable in the vertical direction in conjunction with the moveable assembly and relative to the shield to modify a volume of the enclosed processing region.

3. The semiconductor processing chamber of claim 1, wherein the moveable assembly is moveable relative to the inner wall to modify a volume of the enclosed processing region.

4. The semiconductor processing chamber of claim 1, wherein the processing chamber is integrated into a cluster tool containing multiple processing chambers.

5. The semiconductor processing chamber of claim 4, wherein at least one of the other processing chambers of the cluster tool contains a combinatorial processing system.

6. The semiconductor processing chamber of claim 4, wherein the multiple processing chambers are operable to perform a plurality of processes selected from a group consisting of ALD, PVD, CVD, and cold plasma.

7. The semiconductor processing chamber of claim 1, wherein the process head comprises concentric rings enabling deposition in an inner ring and removal of fluids through an outer ring during processing of the site isolated process region.

8. The semiconductor processing chamber of claim 1, wherein the process head moves in a radial direction and the substrate support rotates about an axis.

9. The semiconductor chamber of claim 1, wherein the process head rotates about an axis that is different than a substrate support axis and the substrate support moves linearly within the chamber.

10. The semiconductor processing chamber of claim 1, wherein the shield and the inner wall move independently from each other in the vertical direction.

11. The semiconductor processing chamber of claim 1, wherein multiple process heads are disposed over the substrate, and wherein one of the multiple process heads is configured to perform a process operation different than another one of the multiple process heads.

12. The semiconductor processing chamber of claim 4, wherein at least one of the other processing chambers of the cluster tool contains a non-combinatorial processing system.

13. The semiconductor processing chamber of claim 4, wherein the multiple processing chambers enable processing operations by at least two of ALD, PVD, CVD, and cold plasma.

* * * * *